(12) United States Patent
Chen et al.

(10) Patent No.: US 6,828,081 B2
(45) Date of Patent: Dec. 7, 2004

(54) METHOD AND SYSTEM FOR LITHOGRAPHY USING PHASE-CHANGE MATERIAL

(75) Inventors: Yi-Chou Chen, Hsinchu (TW); Chih-Yuan Lu, Hsinchu (TW); Hsiang-Lan Lung, Hsinchu (TW); Li-Hsin Chuang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 70 days.

(21) Appl. No.: 10/315,003

(22) Filed: Dec. 10, 2002

(65) Prior Publication Data

US 2004/0110094 A1 Jun. 10, 2004

(51) Int. Cl.$^7$ ................................................. H01L 21/82
(52) U.S. Cl. ........................ 430/311; 430/330; 438/128; 438/129; 438/132; 365/113
(58) Field of Search ................................. 430/311, 330; 438/128, 129, 132; 365/113

(56) References Cited

U.S. PATENT DOCUMENTS

2004/0037106 A1 * 2/2004 Lu et al. ........................ 365/96

OTHER PUBLICATIONS

IBM Technical Disclosure Bulletin, Producing Microscopic Patterns on chalcogenide films, Mar. 1, 1972, Vol. No. 14, pp. 3133–3134.*

* cited by examiner

Primary Examiner—John A. McPherson
Assistant Examiner—Deborah Chacko-Davis
(74) Attorney, Agent, or Firm—Shaw Pittman LLP

(57) ABSTRACT

Methods and systems are provided for forming an electrical interconnect layer between two layers of an integrated circuit. The interconnect layer is formed using a material having a first electrical conductivity corresponding to a first state and a second electrical conductivity corresponding to a second state, where the first electrical conductivity is different from the second electrical conductivity. An area of the material of the interconnect layer may be selected, for example, using a mask. Then energy may be applied to the selected area to change the electrical conductivity of the material in the selected area of the interconnect layer. Thus, the present invention may be used to implement optical memory devices which may be read by an electrical circuit.

24 Claims, 4 Drawing Sheets

METHOD AND SYSTEM FOR LITHOGRAPHY USING PHASE-CHANGE MATERIAL

DESCRIPTION OF THE INVENTION

1. Field of the Invention

The invention relates to manufacturing integrated circuits in general, and to manufacturing optical memory devices in particular.

2. Background of the Invention

Phase change materials may be switched from one detectable state to another detectable state by the application of energy. The states of phase change materials may differ in their morphology, relative degree of order, or relative degree of disorder, creating a detectable difference in electrical conductivity, electrical resistance, optical transmissivity, optical absorption, optical reflectivity, or any combination thereof.

Conventional systems for using phase-change material, such as chalcogenide, to implement optical data storage media may be classified into two categories. The first category includes media that are optically read and written, such as CD-Rewritable (CD-RW) memory, Powerful Optical Disk System (PD) memory, and Digital Versatile Disk RAM (DVD-RAM). The second category includes media that are electrically read and written, such as Ovonic Unified Memory (OUM).

The first category uses the optical properties of phase change material to implement memory. These optical data storage devices use a structure wherein the phase change material used as a data storage medium is supported by a substrate and encapsulated in encapsulants. The encapsulants may include anti-ablation materials, thermal insulating materials and layers, anti-reflection layers between a projected beam source and the data storage medium, reflective layers between the optical data storage material and the substrate, and the like. The structure of the optically read and written memory may be simple, and the price of the media (e.g. an optical disk) may be inexpensive. However, an optical system (e.g. DVD-RAM player) is necessary to read the data stored on the media. The optical system is relatively large and expensive as compared to the media. Moreover, the optical system is relatively slow and consumes significant power.

The second category implements memory using phase change materials that may be electrically switched between a generally amorphous state and a generally crystalline state, or between different resistive states while in crystalline form. A relatively large electrical current is required to program these memory devices. In the OUM, at least 1 mA of current is required to program each bit; however, the current required to read a bit is considerably less. In traditional metal-oxide semiconductor (MOS) integrated circuits it is very difficult to provide a source/drain current of more than 1 mA for a minimum size device. In addition, even if it were possible to provide larger source/drain currents, the relatively high power consumption would be very undesirable for many applications.

Conventional processes for manufacturing integrated circuits use a sequence of deposition and etching processes to establish electrical pathways to features of the integrated circuit. For example, a manufacturer may make an integrated circuit, such as a memory device, by using a diffusion process to establish substrate channels on a silicon semiconductor wafer. The manufacturer may use known techniques to form a crystalline epitaxial layer on top of the substrate channels. Then the manufacturer may use known masking and doping techniques to establish isolation channels in the epitaxial layer that isolate adjacent memory cells from each other.

A layer of thermally-grown $SiO_2$ may be formed on the top of the epitaxial layer and etched to form apertures over the areas between the isolation channels in the epitaxial layer. Then diffusion regions may be formed within the areas of the apertures of the $SiO_2$ layer, and one or more electrode contact layers may be deposited within the apertures. Next, a chalcogenide layer may be formed on top of the electrode contact layers and within the pore defined by the aperture, using known thin-film deposition techniques, and additional layers of electrode contact material may be formed on top of the chalcogenide layer.

Individual memory cells are formed by the combination of the lower electrode contact layers, the chalcogenide layer, and the upper electrode contact layers. The upper electrode contacts may be joined using electrical conductors that are arranged perpendicular to the substrate channels, such that each of these conductors is electrically coupled to a row or column of the memory cells. Finally, the integrated circuit structure may be covered with an encapsulant, such as a plastic material.

The traditional scheme for manufacturing integrated circuits is expensive and complex due in part to the many processing stages required to fabricate an integrated circuit such as a memory device.

SUMMARY OF THE INVENTION

The present invention provides methods and systems for a memory which may be optically programmed and electrically read. The complex electrical circuits previously used to program memory cells may be eliminated. Additionally, the memory may be directly read using electrical circuits at speeds much faster than possible using optical methods. Moreover, memory devices consistent with the present invention may be directly read using simple electrical circuits that consume minimal power, as compared to the relatively slow and power-hungry devices (e.g. disk drives) required to read traditional optical media. Therefore, this invention provides a fast, power-efficient memory compatible with simple electrical circuits.

The present invention also provides methods and systems for lithography and manufacturing of integrated circuits, such as memory devices, that require fewer processing steps and are less expensive to implement. This is achieved by taking advantage of temperature-dependent characteristics of certain materials, such as chalcogenides, to adjust the electrical resistance between one side of the interconnect layer and the other side of the interconnect layer.

The present invention provides for forming an electrical interconnect layer between two layers of an integrated circuit, the method comprising: forming the interconnect layer using a material having a first electrical conductivity corresponding to a first state and a second electrical conductivity corresponding to a second state, wherein the first electrical conductivity is different from the second electrical conductivity; selecting an area of the material of the interconnect layer; and applying energy to the selected area to change the electrical conductivity of the material in the selected area of the interconnect layer.

The present invention also provides a system configured to form an electrical interconnect layer between two layers of an integrated circuit, the system comprising: means for forming the interconnect layer using a material having a first electrical conductivity corresponding to a first state and a second electrical conductivity corresponding to a second state, wherein the first electrical conductivity is different from the second electrical conductivity; means for selecting an area of the material of the interconnect layer; and means for applying energy to the selected area to change the electrical conductivity of the material in the selected area of the interconnect layer.

Additional aspects of the invention will be set forth in part in the description which follows, and in part will be obvious from the description, or may be learned by practice of the invention. Features of the invention will be realized and attained by means of the elements and combinations particularly pointed out in the appended claims. It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Methods and systems are provided for forming an electrical interconnect layer between two layers of an integrated circuit. An interconnect layer may be formed using material which has a first electrical conductivity corresponding to a first state such as, for example, an amorphous state and a second electrical conductivity corresponding to a second state such as, for example, a crystalline state. Materials may be used that have significantly different electrical conductivity in the first state and the second state. The electrical conductivity of an area of the material of the interconnect layer may be determined by selecting the area and applying energy to the selected area to change the electrical conductivity of the material in the selected area of the interconnect layer.

Figure 1:
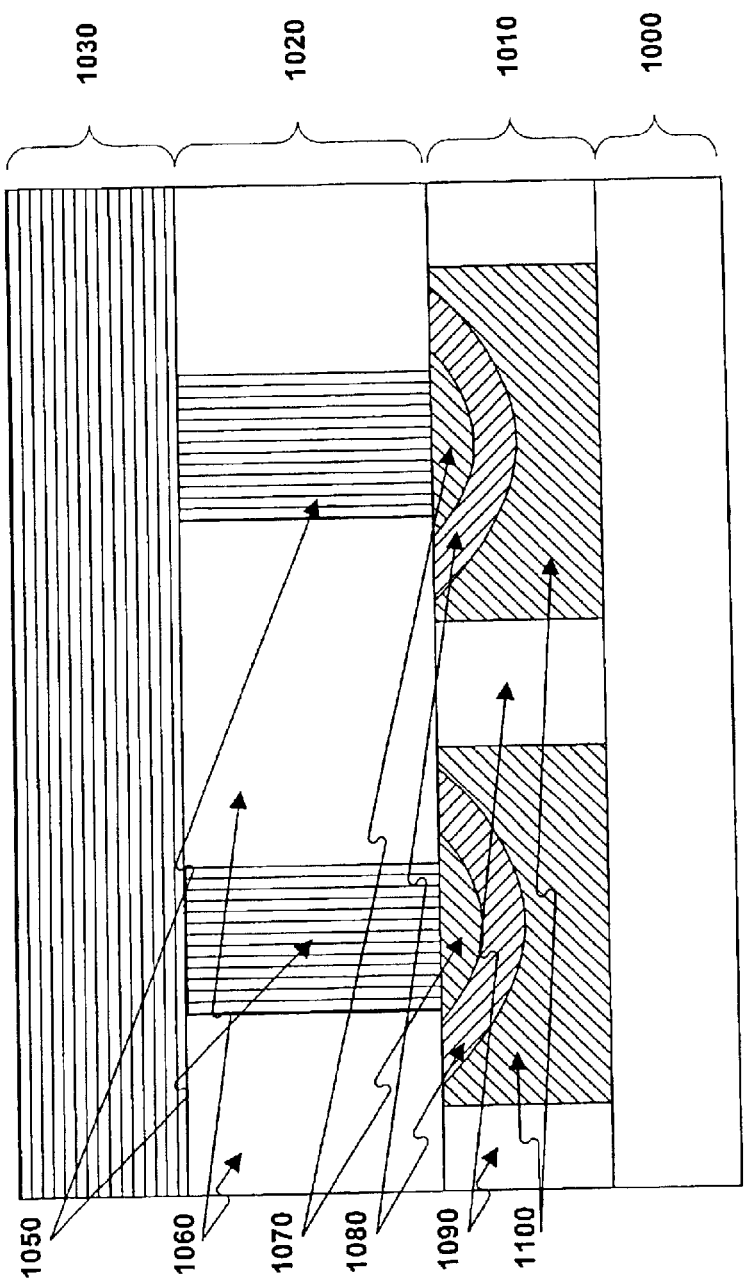
FIG. 1 shows an exemplary architecture for an integrated circuit in accordance with methods and systems consistent with the present invention.

FIG. 1 shows an exemplary architecture for an integrated circuit in accordance with methods and systems consistent with the present invention. An integrated circuit such as, for example, a memory device, may be manufactured using a diffusion process to deposit substrate material 1010 on a wafer 1000. Known techniques may be used to establish one or more channels (1070–1100) in the substrate material 1010. An interconnect layer may be formed using a crystalline epitaxial material 1020 on the substrate channels (1070–1100). The manufacturer may use known masking and doping techniques to establish isolation channels (1060) in the epitaxial layer 1020 that electrically isolate adjacent areas 1050 in the epitaxial layer. Then a layer of phase-change material 1030 may be deposited above the interconnect layer 1020, to selectively couple areas of the integrated circuit.

For example, an integrated circuit such as a memory device may be manufactured on a P substrate 1000 of Si material. An electrical circuit to select a cell of the memory device may be formed by depositing a substrate layer 1010 on the P substrate and by establishing an $N^+$ channel 1100, an $N^-$ channel 1080, and a $P^+$ channel 1070 in the substrate layer 1010. The electrical circuit for selecting the memory cell may include, for example, a FETMOS, a P-N junction, a BJT transistor or a Shottky junction. Adjacent memory cells may be electrically isolated using material 1090 such as $SiO_2$. The memory cells may be electrically coupled through the interconnect layer 1020 using electrical conductors 1050 such as W (tungsten), Al (aluminum) or poly-Si (polysilicon) plugs. In addition, the integrated circuit may include a buffer layer located between the interconnect layer and the phase-change material. For example, the integrated circuit may include a buffer layer having a thickness of 20–200 nm using material such as C (carbon), Mo (molybdenum), Ti N (titanium nitride), Ti W (titanium tungsten) or Ti Al N (titanium aluminum nitride). Then the layer of phase-change material 1030 may be formed using a film of chalcogenide material. The phase change material 1030 may be deposited in either an amorphous state or a crystalline state.

Phase change materials may have one electrical conductivity in a first state and another electrical conductivity in a second state. For example, a chalcogenide alloy such as $Ge_2Sb_2Te_5$ may have an electrical resistance in an amorphous state that is approximately one thousand times higher than the electrical resistance in a crystalline state. Thus, the electrical conductivity of phase-change materials such as, for example, chalcogenides may be changed by adding sufficient energy to change the state of the material. Thus, the electrical conductivity of a phase-change material may be altered by changing the phase-change material between an amorphous state and a crystalline state.

For example, $Ge_2Sb_2Te_5$ chalcogenide may be changed from an amorphous state to a crystalline state by heating it to a temperature above 200° C., and may be melted by heating it to a temperature of 632° C. The chalcogenide may be changed from the crystalline state to the amorphous state by melting the material and then quenching the material. $Ge_2Sb_2Te_5$ chalcogenide has a heat capacity of approximately 1.25 J/cm$^3$, and a heat of fusion of approximately 622 J/cm$^3$. The energy density required to crystallize the phase-change material may be calculated using the equation:

$$E_{CHANGE} = \frac{\text{Heat capacity} \times \text{Volume} \times \text{Temperature difference}}{\text{Absorption efficiency} \times \text{Area}}$$

Assuming a film thickness of 100 Å, an initial temperature of 25° C. and an absorption efficiency of 70%, the energy density required to crystallize the chalcogenide by heating it to 250° C. is 0.4 mJ/cm². The energy density required to melt the chalcogenide may be calculated using the equation:

$$E_{MELT} = \frac{\text{Heat capacity} \times \text{Volume} \times \text{Temperature difference} + \text{Heat of fusion} \times \text{Volume}}{\text{Absorption efficiency} \times \text{Area}}$$

Thus, the energy density required to melt the chalcogenide by heating it to 632° C. is 2 mJ/cm².

The energy required to crystallize or melt the chalcogenide may be provided in many different ways. For example, the energy may be provided using a coherent light source such as a laser. For another example, the energy may be provided using a non-coherent light source, such as a xenon bulb. For yet another example, the energy may be provided by using a heater. For still another example, the energy may be provided by combining more than one method, such as by heating the material to a first temperature with a heater, and further heating selected areas of the material to a second temperature using a light source.

Figure 2:
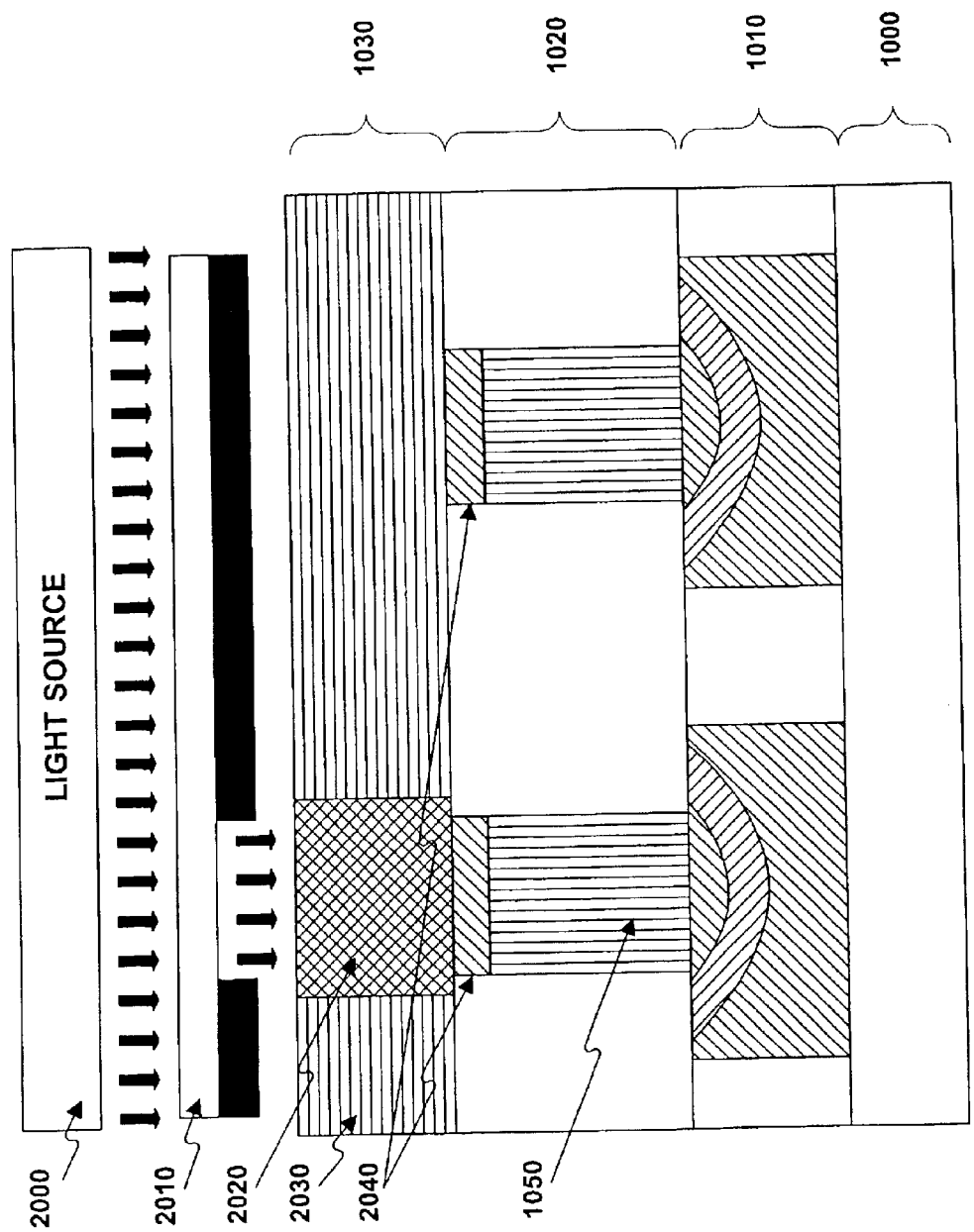
FIG. 2 shows an exemplary system for changing the state of a selected area of material in a phase-change layer, in accordance with methods and systems consistent with the present invention.

FIG. 2 shows an exemplary system for changing the state of a selected area 2020 of material in a phase-change layer 1030, in accordance with methods and systems consistent with the present invention. A light source 2000 may be used to transfer energy to the phase-change material 1030. For example, a laser may be used to heat the phase-change material 1030 by illuminating the material 1030 until it reaches the predetermined temperature necessary to change state. A mask 2010 such as, for example, a photolithography mask, may be used to apply the energy to a selected area 2020 of the phase-change material 1030. The mask 2010 may block the energy provided by the light source 2000 from reaching other areas 2030 of the phase-change material 1030. Thus, the state of the phase-change material 1030 in the selected area 2020 may be altered, without altering the state of the phase-change material 1030 outside the selected area 2020.

For example, the light source 2000 may illuminate the mask 2010, which permits the light source 2000 to illuminate the selected area 2020 in the phase-change material 1030, while preventing the light source 2000 from illuminating other areas 2030 in the phase-change material 1030. The light source 2000 may illuminate the selected area 2020 until the selected area 2020 meets or exceeds a temperature required to change state such as, for example, from the amorphous state to the crystalline state. Thus, the electrical conductivity of the phase-change material 1030 may be altered in the selected area 2020 to establish (or remove) an electrical connection through the phase-change material 1030 to the buffer layer 2040 that is coupled to the electrical conductor 1050 in the interconnect layer 1020. If the buffer layer 2040 is omitted, then the phase-change material 1030 may be altered in the selected area 2020 to establish (or remove) an electrical connection through the phase-change material 1030 to the interconnect layer 1020.

Figure 3:
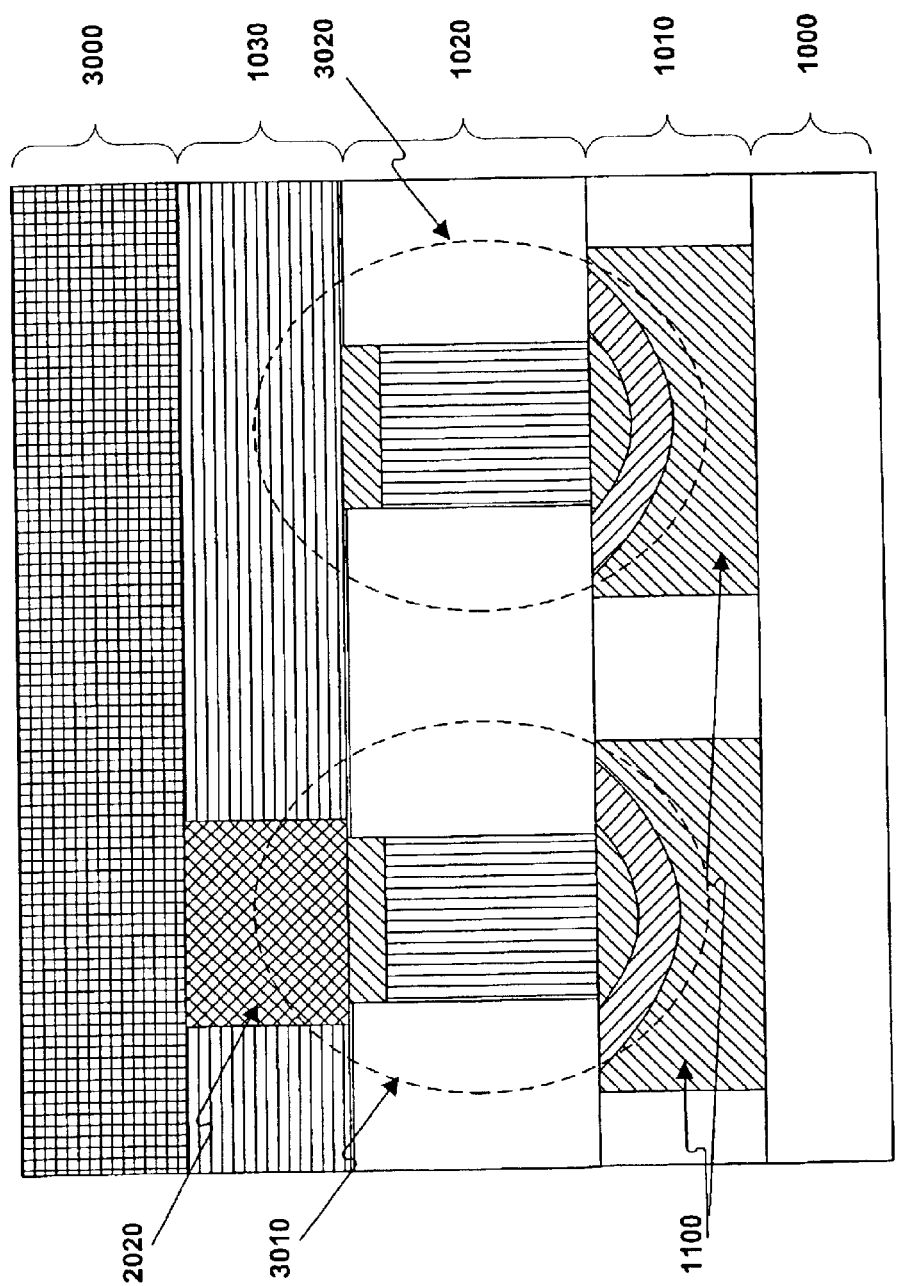
FIG. 3 shows an exemplary architecture for a memory device in accordance with methods and systems consistent with the present invention.

FIG. 3 shows an exemplary architecture for a memory device in accordance with methods and systems consistent with the present invention. An electrical conductor 3000 may be coupled to the phase-change material 1030 to access a row or a column of memory cells (3010, 3020). The electrical conductor 3000 may be arranged perpendicular to the channel 1100 in the substrate layer 1010 such that each memory cell (3010, 3020) may be individually accessed by row and column. When memory cell 3010 is accessed, current may flow through high-conductivity area 2020 of the phase-change material 1030 which may correspond, for example, to a logical 'zero.' However, when memory cell 3020 is accessed, current may not flow through phase-change material 1030 which may correspond, for example, to a logical 'one.' Therefore, the memory device may be configured to store logic 'one' values and logic 'zero' values by configuring the state of one or more selected areas in the phase-change material 1030.

Figure 4:
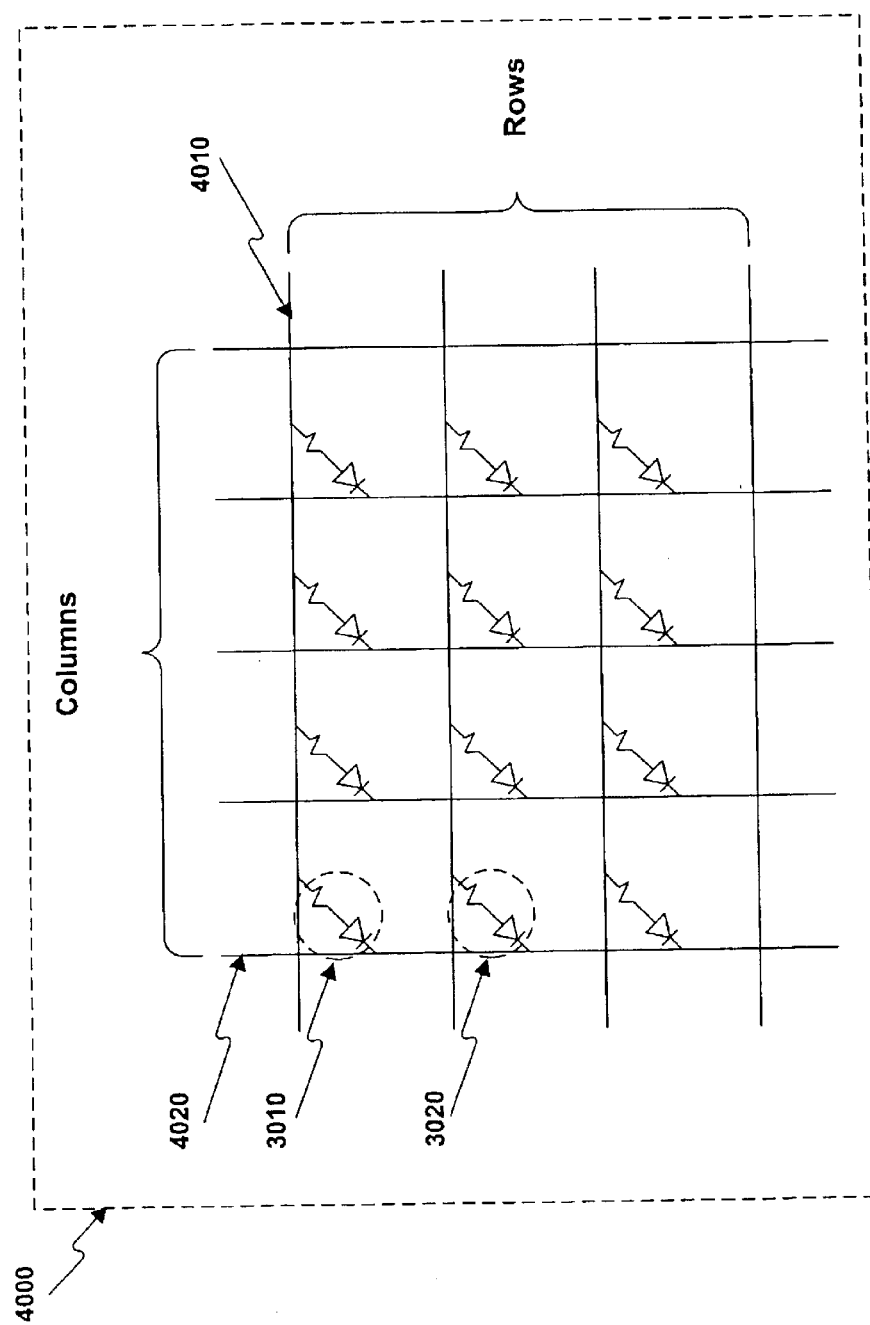
FIG. 4 shows an exemplary architecture for accessing a specific memory cell of a memory device in accordance with methods and systems consistent with the present invention.

FIG. 4 shows an exemplary architecture for accessing a specific memory cell 3010 of a memory device 4000 in accordance with methods and systems consistent with the present invention. A memory device 4000 may be arranged as an ordered array of memory cells (3010, 3020), each of which is coupled to row lines and column lines. A specific memory cell 3010 may be accessed using a specific row 4010 and a specific column 4020. Thus, the logical value of memory cell 3010 may be determined by measuring the conductivity of an electrical circuit through the appropriate row 4010 and column 4020 which are coupled to the memory cell 3010. Therefore, the present invention may be used to implement an optical memory which can be read directly by an electrical circuit.

The above embodiments and other aspects and principles of the present invention may be implemented in various environments. Such environments and related applications may be specially constructed for performing the various processes and operations of the invention or they may include a general-purpose computer or computing platform selectively activated or reconfigured by program code to provide the necessary functionality. The processes disclosed herein are not inherently related to any particular computer or other apparatus, and may be implemented by a suitable combination of hardware, software and/or firmware. For example, various general-purpose machines may be used with programs written in accordance with teachings of the present invention, or it may be more convenient to construct a specialized apparatus of system to perform the required methods and techniques.

Various combinations of features are possible, and methods and systems consistent with the present invention may omit one or more features disclosed in the examples provided. For example, a memory device consistent with the present invention may omit interconnect layer 1020. That is, phase-change material layer 1030 may be coupled directly to substrate layer 1010.

The examples presented herein disclose manufacturing of, for example, a memory device, whereas methods and systems consistent with the present invention may be applied to manufacturing other electronic integrated circuits, and should not be construed as limited to embodiments disclosed by way of example.

The present invention also relates to computer readable media that include program instructions or program code for performing various computer-implemented operations based on the methods and processes of the invention. The media and program instructions may be those specially designed and constructed for the purposes of the invention, or they may be of the kind well-known and available to those having skill in the computer software arts. Examples of program instructions include micro-code, machine code, such as produced by a compiler, and files containing a high-level code that can be executed by the computer using an interpreter.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming an electrical interconnect layer between two layers of an integrated circuit, the method comprising:
   forming the interconnect layer using a material having a first electrical conductivity corresponding to a first state and a second electrical conductivity corresponding to a second state, wherein the first electrical conductivity is different from the second electrical conductivity;
   selecting an area of the material of the interconnect layer;
   applying energy to the selected area to change the electrical conductivity of the material in the selected area of the interconnect layer; and
   heating the selected area to a predetermined temperature by illuminating the selected area with a light source,
   wherein the selected area is determined by using a mask to select the area of the material.

2. The method of claim 1, wherein said applying energy to the selected area of the material comprises heating the selected area of the material to a predetermined temperature sufficient to change the state of the material.

3. The method of claim 2, wherein the predetermined temperature is sufficient to crystallize the material.

4. The method of claim 2, wherein the predetermined temperature is less than a melting temperature of the material.

5. The method of claim 2, further comprising;
   heating the material of the interconnect layer to a first predetermined temperature less than a crystallization temperature of the material.

6. The method of claim 5, further comprising heating the selected area of the material to a second predetermined temperature, higher than the first temperature.

7. The method of claim 6, wherein the second predetermined temperature is at least as large as a crystallization temperature of the material.

8. The method of claim 1, wherein the light source is a laser.

9. The method of claim 1, wherein the material is a chalcogenide alloy.

10. The method of claim 9, wherein the first state is an amorphous state and the second state is a crystalline state.

11. The method of claim 10, wherein the first electrical conductivity is less than the second electrical conductivity.

12. The method of claim 1, wherein applying energy to the selected area of the material further comprises:
   using a mask to determine the selected area of the material; and
   using a light source and the mask to illuminate the selected area.

13. A system configured to form an electrical interconnect layer between two layers of an integrated circuit, the system comprising:
   means for forming the interconnect layer using a material having a first electrical conductivity corresponding to a first state and a second electrical conductivity corresponding to a second state, wherein the first electrical conductivity is different from the second electrical conductivity;
   means for selecting an area of the material of the interconnect layer; and
   means for applying energy to the selected area to change the electrical conductivity of the material in the selected area of the interconnect layer,
   wherein said means for heating the selected area further comprises means for illuminating the selected area with a light source to heat the selected area to a predetermined temperature, and
   wherein the selected area is determined by using a mask to select the area of the material.

14. The system of claim 13, wherein said means for applying energy to the selected area of the material comprises means for heating the selected area of the material to a predetermined temperature sufficient to change the state of the material.

15. The system of claim 14, wherein the predetermined temperature is sufficient to crystallize the material.

16. The system of claim 14, wherein the predetermined temperature is less than a melting temperature of the material.

17. The system of claim 14 further comprising:
   means for heating the material of the interconnect layer to a first predetermined temperature less than a crystallization temperature of the material.

18. The system of claim 17, further comprising means for heating the selected area of the material to a second predetermined temperature, higher than the first temperature.

19. The system of claim 18, wherein the second predetermined temperature is at least as large as a crystallization temperature of the material.

20. The system of claim 13, wherein the light source is a laser.

21. The system of claim 13, wherein the material is a chalcogenide alloy.

22. The system of claim 21, wherein the first state is an amorphous state and the second state is a crystalline state.

23. The system of claim 22, wherein the first electrical conductivity is less than the second electrical conductivity.

24. The system of claim 13, wherein applying energy to the selected area of the material further comprises:
   means for determining the selected area of the material using a mask; and
   means for illuminating the selected area using a light source and the mask.

* * * * *